United States Patent [19]
Duval

[11] Patent Number: 5,955,244
[45] Date of Patent: *Sep. 21, 1999

[54] METHOD FOR FORMING PHOTORESIST FEATURES HAVING REENTRANT PROFILES USING A BASIC AGENT

[75] Inventor: Paul J. Duval, Lexington, Mass.

[73] Assignee: Quantum Corporation, Milpitas, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/704,471

[22] Filed: Aug. 20, 1996

[51] Int. Cl.$^6$ ........................................... G03F 7/00
[52] U.S. Cl. ........................... 430/314; 430/313; 430/319
[58] Field of Search ................... 430/311, 313, 430/314, 315, 319, 323, 324, 327, 329

[56] References Cited

U.S. PATENT DOCUMENTS

| | | | |
|---|---|---|---|
| 3,173,787 | 3/1965 | Clement et al. | 96/35 |
| 3,307,951 | 3/1967 | Adams et al. | 96/86 |
| 3,690,880 | 9/1972 | Muzyczko et al. | 96/33 |
| 3,960,560 | 6/1976 | Sato | 96/36 |
| 3,966,473 | 6/1976 | Sato | 96/36 |
| 4,247,616 | 1/1981 | Vikesland et al. | 430/192 |
| 4,318,975 | 3/1982 | Kuznetsov et al. | 430/260 |
| 4,377,633 | 3/1983 | Abrahamovich | 430/312 |
| 4,544,622 | 10/1985 | Kausch | 430/278 |
| 4,797,343 | 1/1989 | Nakamura | 430/138 |
| 5,348,835 | 9/1994 | Oba et al. | 430/192 |
| 5,460,917 | 10/1995 | Kobayashi et al. | 430/165 |
| 5,498,506 | 3/1996 | Wengenroth et al. | 430/270.14 |
| 5,518,579 | 5/1996 | Katsuyama et al. | 156/659.11 |
| 5,518,860 | 5/1996 | Niikura et al. | 430/191 |
| 5,518,864 | 5/1996 | Oba et al. | 430/325 |
| 5,645,979 | 7/1997 | Mochizuki | 430/325 |
| 5,660,261 | 8/1997 | Winkle | 430/270.1 |

*Primary Examiner*—Kathleen Duda
*Attorney, Agent, or Firm*—Janoh & Assoc.; Debra A. Chun

[57] ABSTRACT

The process of the present invention is used to form resist features (22) having controlled predefined cross-sectional profiles, and is particular useful for forming features having reentrant profiles (24). In the process, a layer of a basic agent is formed on the substrate surface (20). Thereafter, a resist layer is formed on the layer of basic agent, causing at least a portion of the basic agent to diffuse into regions of the resist layer. The resist layer is exposed to radiant energy through a mask to form a patterned resist layer, which is developed to form resist features (22) having reentrant profiles (24) at those regions of the resist layer containing the diffused basic agent. The reentrant resist features (22) formed by the present method facilitates manufacture of magnetic heads, magnetoresistive sensors (102), and electronic components.

35 Claims, 6 Drawing Sheets

CEM-BC5 surface pH=3.53

400D surface treatment

Ammonium Hydroxide
treatment pH=13.92

Ethylenediamine treatment pH>14.0

METHOD FOR FORMING PHOTORESIST FEATURES HAVING REENTRANT PROFILES USING A BASIC AGENT

BACKGROUND

The present invention relates to a method of forming patterned photoresist features that are useful for fabricating thin film circuits, such as magnetic, electronic, and semiconductor circuits.

In the fabrication of electronic and magnetic circuit components, photolithographic processes are used to form miniaturized devices having features that are often sized less than 1 $\mu$m. In conventional photolithographic methods, a layer of light-sensitive resist material is applied on a substrate, and a photomask is used to expose the resist to a desired pattern of radiation, such as ultraviolet light. The photomask can be superimposed on the resist (contact method), or a photomask can be projected onto the resist (projection method). Thereafter, the exposed photoresist is developed to form a pattern of raised photoresist features 10 on the substrate 12, as illustrated in FIG. 1.

In modern circuit fabrication, proper control of the shape of the photoresist features 10 formed on the substrate is highly desirable. For example, when subsequent processing steps deposit material on, or etch material from, between the resist features 10, it is desirable for the resist features to have sidewalls 14 that are substantially vertical and perpendicular to the surface of the substrate. However, conventional photolithographic processes often produce resist features 10 having a spread-out foot 16 at the bottom of the features, as schematically illustrated in FIG. 1, that result from the chemical interaction of the resist layer with the substrate surface 18.

Conventional methods have been developed to reduce the spreading out of the foot 16 of the resist feature 10. For example, Dean and Carpio, in OCG Interface 94 Proceedings, "Contamination of Positive Deep-UV Photoresist," Sematech, Austin, Tex. (1994), teach that a coating of silicon dioxide on the substrate can serve as a barrier which prevents undesirable chemical reaction between the resist and the substrate, allowing the resist features to have a substantially vertical sidewalls, and to minimize spreading-out at the bottom of the resist feature. However, such coatings are often difficult to remove on completion of the resist utilizing fabrication step, without adversely affecting the underlying or adjacent materials on the substrate surface. Also, the additional step adds to processing cost and reduces processing throughput.

Moreover, in certain fabrication processes, it is desirable for the resist features to have cross-sectional profiles that are reentrant at the bottom of the features. By "reentrant profile," it is meant that the sidewalls of the resist features taper inwardly at the bottom of the feature, and more preferably form an elongated trench parallel to the substrate surface, the trench positioned along the junction of the resist feature and the substrate surface. Such a profile is particularly desirable when material is conformally deposited on and between the resist features to form electrical interconnect lines or to fill holes on the substrate. In these processes, a solvent is used to remove the residual resist, in a process commonly known as a lift-off process. The material conformally deposited over the resist features (which is often highly chemically resistant) prevents penetration of the solvent below the conductive layer to allow removal of the resist. However, the reentrant resist features cause a shadowing effect during deposition, that results in formation of an elongated void substantially absent deposition material, at the edge of the bottom surface of the resist feature in contact with the substrate. It is through this void that the solvent enters and dissolves the residual resist.

Conventional methods used to obtain reentrant resist features using negative or image-reversal photoresist underexpose the bottom portion of the resist layer by limiting the exposure of the resist layer to radiation. However, these processes are sensitive to the chemical species on the surface of the substrate which affects the chemical reactions between the overlying resist and the substrate. Because different substrates have different surface chemistry and activity, such processes have often limited applications and reproducibility. Other methods have been used to control the profile of features formed using positive photoresist material. These methods typically chemically modify the surface of the resist layer to decrease the solubility of the surface of the resist to provide a larger width at the top surface as compared to the bottom of the feature. In one method, the resist layer is immersed into chlorobenezene solution; in another method, vapor silanation is used. However, many complex and difficult-to-control variables affect the surface chemistry of the features. Also, these methods often result in poor adhesion between the resist and the underlying substrate, and can also provide inconsistent resist development times. In yet another method, multiple coatings, typically 2 to 3 coatings, are used to produce the reentrant profiles. These methods depend on differences in the etch rate of the layers in a developing agent or plasma to produce the reentrant profiles. However, these processes use multiple and often complex process steps that can increase the cost of processing the substrate.

Thus it is desirable to have a process for forming resist features having controlled and predefined cross-sectional profiles. It is further desirable to have a process for forming resist features having reentrant profiles at the bottom of the features. It is also desirable for the resist forming process to use materials that are chemically compatible with the substrate to reduce corrosion and/or contamination of the substrate during formation of the resist features. It is further desirable for the process to be compatible with conventional processes to allow easy integration into conventional manufacturing apparatus.

SUMMARY

The process of the present invention is useful for forming resist features having controlled predefined cross-sectional profiles, and particularly for forming resist features having reentrant profiles. In the process, a layer of a basic agent is formed on the substrate surface. Thereafter, a resist layer is formed on the layer of basic agent, so that at least a portion of the basic agent diffuses into regions of the resist layer. The resist layer is exposed to radiant energy through a mask to form a patterned resist layer, which is developed to form resist features having reentrant profiles at the regions of the resist layer comprising the diffused basic agent. The reentrant resist features formed by the present method facilitates manufacture of conductive features on the substrates such as magnetic heads, magnetoresistive sensors, and electronic components.

The basic agent typically comprises a pH of from about 7.1 to about 14, and more preferably comprises a pH of at least about 11. Preferably, the concentration of basic agent absorbed into the regions of the resist layer is (i) sufficiently high to neutralize at least some of the acidic byproducts formed in the resist upon exposure to the radiant energy; and (ii) sufficiently low to prevent complete neutralization of the acid byproducts formed during exposure to the radiant energy, otherwise it would result in breakup of the resist features. Preferably, the basic agent comprises alkali metal hydroxides, alkaline earth metal hydroxides, alkylammoniums, metal carbonates, and secondary or tertiary metal phosphates. Alternatively, the basic agent can comprise (i) aliphatic amines having the general formula R—$NH_2$, where R is a hydrogen, hydroxy, or alkyl group, (ii) alkyl-substituted aromatic amines, or (ii) hydroxylalkyl-substituted aromatic amines.

In another aspect, the present method is used to form resist features having predefined cross-sectional profiles on a substrate. In this process, a layer of a basic agent is formed on a substrate, and a resist layer is formed over the basic agent layer so that the basic agent diffuses into the resist layer. The resist layer is irradiated with radiant energy through a mask to activate portions of the resist layer forming an acidic byproduct in the resist. The concentration of basic agent diffused into the resist layer is sufficiently high to neutralize the acidic byproduct at regions of the resist layer to allow formation of resist features having the predefined cross-sectional profile. Upon development in a suitable developing solution, the resist layer is dissolved at (i) unirradiated portions of the resist layer, and (ii) irradiated portions of the resist layer in which the acidic byproduct is substantially neutralized by the basic agent, to form resist features having the predefined cross-sectional profile.

A preferred method of forming a magnetoresistive sensor or magnetic head utilizing the process of the present invention, comprises the steps of (i) forming a layer of a basic agent on a substrate surface; (ii) forming a resist layer on the layer of basic agent, wherein at least a portion of the basic agent diffuses into regions of the resist layer; (iii) exposing the resist layer to radiant energy through a mask to form a patterned resist layer; (iv) developing the patterned resist layer to form resist features having reentrant profiles at the regions of the resist layer comprising the basic agent; (v) depositing material between the resist features having the reentrant profile; and (vi) dissolving the resist features using a resist stripper.

DRAWINGS

These and other features, aspects, and advantages of the present invention will be better understood from the following drawings, description and appended claims, which illustrate examples of the invention, where:

Figure 5A:
Figure 5B:
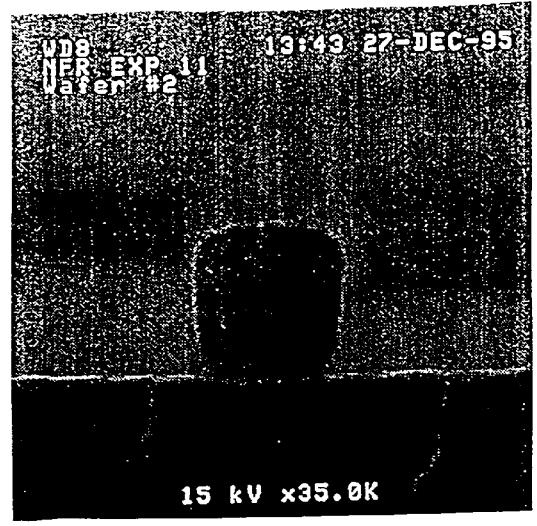
Figure 5C:
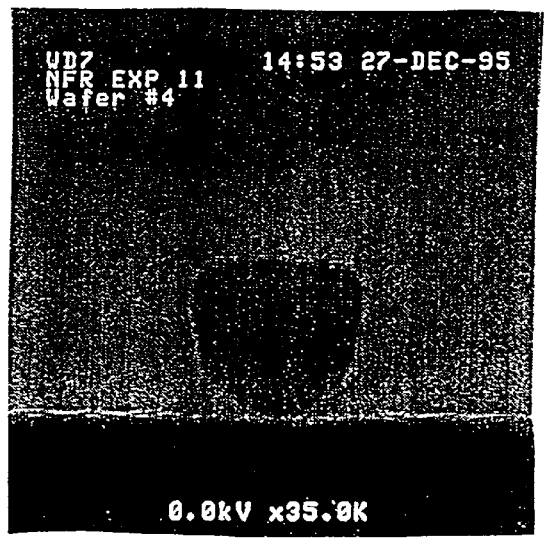
Figure 5D:
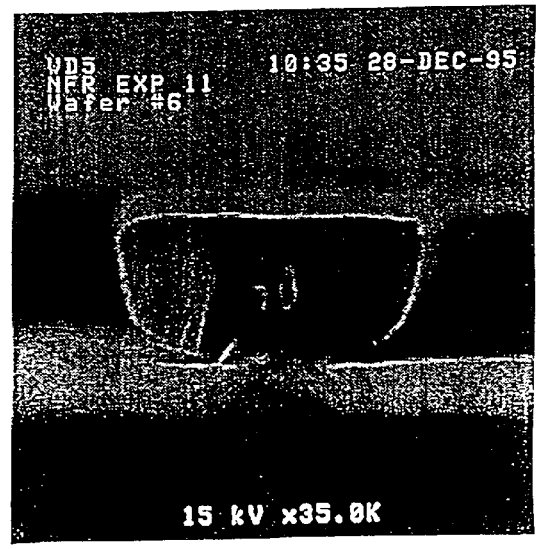

FIG. 5a (Prior Art) shows an SEM photograph of a cross-section of a typical resist feature formed by conventional process wherein the surface of the substrate has an acidic pH of 3.53; and FIGS. 5b through 5d show SEM photographs of cross-sections of reentrant resist features formed on substrates treated with basic agents having increasing concentration or pH strengths, according to the present invention.

DESCRIPTION

The present invention can be used in any photolithographic process, including photolithographic processes used in the manufacture of semiconductor devices, magnetic recording and reading devices, and display devices. The present process is particularly useful for forming magnetoresistive sensors, and thin film magnetic heads that are used to perform "read" and "write" operations on magnetic storage media such as for example disk drives, tape drives, and magnetic drum.

The photolithographic process is used to form electronic and magnetic devices on a substrate 20, such as semiconductor substrates for example silicon and gallium arsenide wafers; and magnetic component substrates for example silicon carbide and $TiO_2$ sintered substrates. The substrates 20 are typically sized from about 75 to about 305 mm (3" to 12") in diameter and are from about 1 to 5 mm thick. The photolithographic process is used to form a pattern of resist features 22, such as patterned lines and/or holes, on the substrate 20. Thereafter, material is deposited upon, or etched from, the substrates 20 to form active devices and interconnecting circuitry, such as electrically conductive, insulative, magnetic, or semiconductive features. For example, conductive material is often deposited between patterned resist features 22 to form electrically conductive features, such as interconnect lines, plugs, or coils. In another example, patterned resist features 22 can be formed over the substrate 20, and the portions of the substrate between the resist features etched to form a desired pattern of features.

Figure 2A:
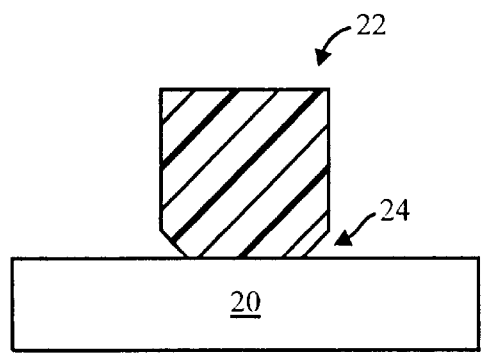
FIGS. 2a and 2b show schematic cross-sectional side views of a reentrant resist feature formed on a substrate coated with a basic agent having (I) a relatively low basic concentration or pH, and (ii) a high basic concentration or pH, respectively.
Figure 2B:
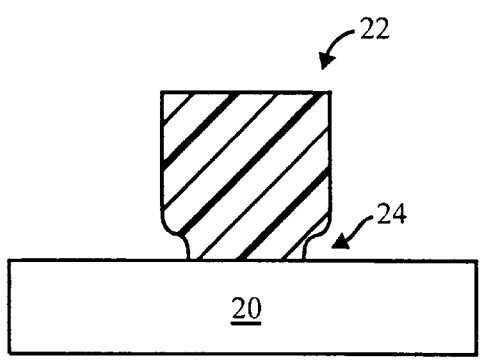

In general, the process comprises the steps of (i) forming a layer of a basic agent on the substrate surface 20, (ii) forming a resist layer on the layer of basic agent, so that at least a portion of the basic agent is diffused and/or absorbed into regions of the resist layer, (iii) exposing the resist layer to radiant energy through a mask to form a patterned resist layer, and (iv) developing the exposed resist layer form resist features 22 having predefined cross-sectional profiles, and preferably, reentrant profiles 24 at the regions of the resist layer containing the diffused basic agent, as illustrated in FIGS. 2a and 2b. The reentrant resist features 22 formed by the present method facilitates manufacture of conductive or magnetic elements on the substrates 20 such as magnetic heads, magnetoresistive sensors, and electronic components, as described below.

In the first step of the process, a basic agent is coated onto the substrate 20. By basic agent it is meant a chemical base having a pH of from about 7.1 to about 14, more preferably at least about 11, and most preferably at least about 13. The basic agent can comprise inorganic bases, organic bases, base precursors, or combinations of two or more bases, and/or can be diluted using conventional solvents as described below. Suitable inorganic bases include alkali metal hydroxides, alkaline earth metal hydroxides, alkylammoniums, metal carbonates, and secondary or tertiary metal phosphates; including by way of example, sodium phosphate, potassium phosphate, ammonium phosphate, sodium carbonate, potassium carbonate, ammonium carbonate, sodium hydrogen carbonate, potassium hydrogen carbonate, ammonium hydrogen carbonate, ammonium hydroxide, sodium hydroxide, potassium hydroxide, and lithium hydroxide.

Preferred organic bases include aliphatic amines having the general formula $R-NH_2$, where R is a hydrogen, hydroxy, or alkyl group; such as for example, alkylamines, hydroxylamines, and aliphatic polyamines; including by way of example, hydroxylamines, aliphatic polyamines, monomethylamine, dimethylamine, trimethylamine, monoethylamine, diethylamine, triethylamine, ethylenediamine, monoisopropylamine, di-isopropylamine, tri-isopropylamine, η-butylamine, monoethanolamine, diethanolamine, triethanolamine, monoisopropanolamine, di-isopropanolamine, tri-isopropanolamine, imine, and pyridine.

Suitable aromatic amines include for example, (i) alkyl-substituted aromatic amines, or (ii) hydroxylalkyl-substituted aromatic amines. Suitable aromatic amines include phenylenediamine, tolylenediamine, diamino-diphenyl-ether, diamino-diphenyl sulfone, diamino-diphenyl-methane, diamino-diphenyl-sulfide, diamino-diphenyl-ketone, aminophenyl propanes, aminophenoxy-benzenes, aminophenyl-pentenes, aminobenzylbenzene, diaminoaphthalene, phosphine oxide, diamino-azobenzene, diamino diphenylurea, amino-phenoxyphenyl, aminophenoxypheny-benzophenone, aminophenoxy-diphenyl-sulfone, dimethyl-aminobenzyl phenoxy benzophenone, diaminohydroxybenzene, dihydroxy-diaminobiphenyl, amino-hydroxyphenyl propanes, amino-hydroxyphenyl-alkanes, aminopropyldimethylsilyl benzene, dimethoxy-diaminophenyl, dimethyl-diaminobiphenyl, aminophenyl anthracene, aminophenyl fluorene, and diaminobenzamilide.

Instead of a base, the basic agent can also comprise base precursors that are capable of forming bases upon activation by radiant or thermal energy, including for example, salts of bases and organic acids that are capable of decarboxylation by heating, compounds capable of releasing amines through intramolecular nucleophilic substitution or rearrangement, and those capable of releasing bases by electrolysis. Preferred base precursors include guanidine trichloroacetate, piperidine trichloroacetate, morpholine trichloroacetate, p-toluidine trichloroacetate, 2-picoline trichloroacetate, guanidine phenylsulfonylacetate, guanidine 4-chlorophenylsulfonylacetate, guanidine 4-methyl-sulfonylphenylsulfonylacetate, and 4-acetylaminomethyl propionate.

The basic agent is preferably in a solution or liquid form that can be applied to the substrate 20 by spraying, flow-coating, roller-coating, spin-coating, or immersion coating. Typically, the basic solution is applied on the substrate 20 by drip-feeding the solution onto the substrate, while the substrate is spinning in a spin coater. Typically, the spin coater is operated at about 4000 rpm in ambient air. Preferably, the entire substrate 20 is exposed to the basic agent from about 30 to about 120 seconds. The substrate 20 is spin dried to form a ultrathin, possibly monolayer, of basic agent on the surface of the substrate, typically to a thickness of about 0.01 to about 1 μm, and more typically 0.01 to 0.1 μm, and most typically 0.02 to 0.08 μm.

The basic agent can also be incorporated within an antireflection coating, or an adhesion promoting coating, or in the bottom layer of a multilayer resist coating. For example, the basic agent can be mixed into a portion of the resist which is then applied as a thin layer onto the substrate surface. Thereafter, one or more layers of conventional resist material are formed on the bottom layer of resist. Alternatively, a thin bottom layer of resist can be formed on the substrate, and thereafter, impregnated or soaked with the basic agent.

The concentration or pH of the basic agent can be tailored, and application of basic agent onto the substrate 20 can be facilitated, by dissolving the basic agent in a solvent, such as alcohol, ether, and combinations thereof. The solvent typically evaporates when the substrate 20 is heated in subsequent process steps. The concentration or pH of the basic agent should be sufficiently high to allow diffusion into the resist feature 22 in the desired concentration levels, and sufficiently low to prevent damage to the devices formed on the substrate 20. Preferably, the concentration of basic agent is (i) sufficiently high to neutralize at least some of the acidic byproducts formed in the resist upon exposure to the radiant energy; and (ii) sufficiently low to prevent complete neutralization of the acid byproducts formed during exposure to the radiant energy, otherwise it would result in breakup of the resist features. By complete neutralization it is meant that sufficient acidic byproduct remains in the resist to allow the resist to crosslink to form a structure that does not breakup in subsequent process steps. Typically, the basic agent is used in an amount of less than 100% by weight, and more preferably from 0.1 to 40% weight, based on the total solids content of the resist material.

Figure 2C:
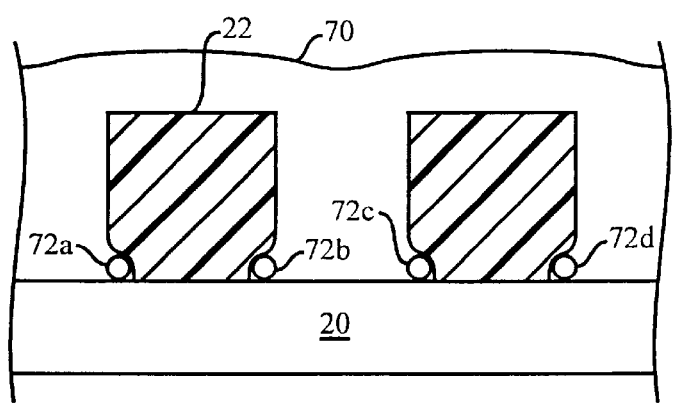
FIG. 2c shows a schematic cross-sectional side view of the voids formed by the shadowing effect of reentrant resist features at the bottom and on either side of the resist features.
Figure 2D:
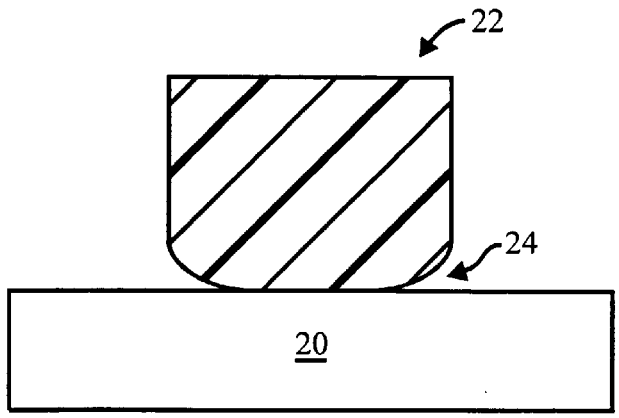
FIGS. 2d to 2f show schematic cross-sectional side views of a reentrant resist feature formed on a substrate coated with basic agents having (i) a relatively low diffusion coefficient, (ii) a medium diffusion coefficient, and (iii) a high diffusion coefficient, respectively.
Figure 2E:
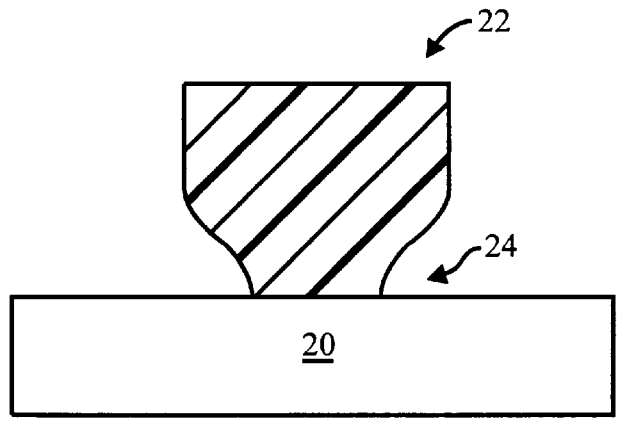
Figure 2F:
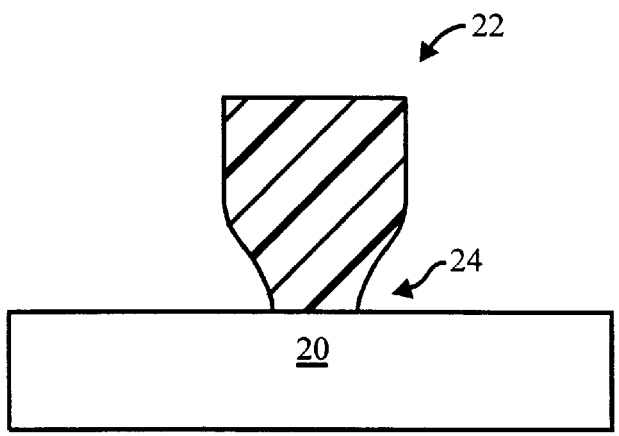

The diffusion coefficient of the basic agent can also be selected, or controlled by supplying energy to the basic agent, for example thermal energy, to control the shape of the resist features. FIGS. 2d to 2f show schematic cross-sectional side views of a reentrant resist feature formed on a substrate coated with basic agents having (i) a relatively low diffusion coefficient, (ii) a medium diffusion coefficient, and (iii) a high diffusion coefficient, respectively. For reentrant profiles, the diffusion coefficient of the basic agent should not be excessively high, as this would cause diffusion into the entire resist feature 22, whereas, the reentrant undercutting is only desirable at the bottom edge of the feature. The diffusion coefficient of the basic agent should be sufficiently high to neutralize the acidic byproduct at regions of the resist layer to allow formation of resist features 22 having the desired predefined cross-sectional profile. Preferably, the diffusion coefficient of basic agent is (i) sufficiently high to permeate a first distance into the bottom of the feature, and (ii) sufficiently low to permeate a second distance in the top of the feature, the first and second distances being different from one another, and more preferably, to obtain reentrant profiles, the first distance being larger than the second distance.

Upon development in a suitable developing solution, the resist layer is dissolved at (i) unirradiated portions of the resist layer, and (ii) irradiated portions of the resist layer in which the acidic byproduct is substantially neutralized by the basic agent, to form resist features 22 having the predefined cross-sectional profile. In this manner, the degree of reentry or the angle of the tapered sidewalls of the resultant resist features 22 can be controlled by adjusting the concentration or pH of the basic agent. Moderate concentration or pH values produce less reentrant profiles 24, and high concentration or pH values produce reentrant profiles having larger reentrant cavities, as illustrated in FIG. 2b. It is a particular advantage of the present invention, that the shape of the resist feature 22 can be controlled by adjusting the concentration, pH, or diffusion coefficient of the basic agent applied on the substrate 20, to achieve a wide variety of cross-sectional profiles of resist features 22.

Figure 1:
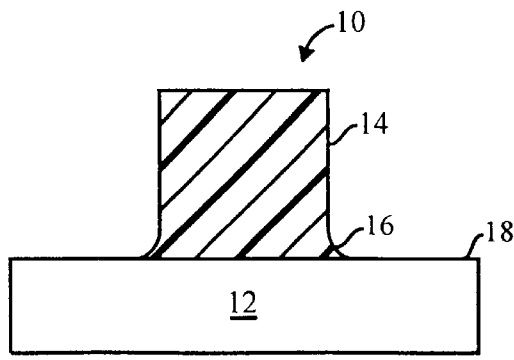
FIG. 1 (Prior Art) shows a schematic cross-sectional side view of a typical resist feature formed on a substrate using a conventional process.

For substrates that have acidic surfaces, such as certain metal surfaces, the concentration of the basic agent is increased to compensate for the acidity of the substrate surface 20. Such acidic surfaces can cause footing to occur at the junction of the resist and substrate 20 because of chemical reaction of the resist with the acidic substrate surface. This results in resist features 22 having sidewalls that taper outwardly toward the bottom of the resist feature, as illustrated in FIG. 1. The basic agent neutralizes at least a portion of the acidic surface to provide the desired resist profile, including substantially vertical resist profiles.

When the substrate 20 is coated with a thin organic antireflective coating—such as AZ BARLi fabricated by Hoechst-Celanese, Summerville, N. J., or ARC products commercially available from Brewer Science, Rolla, Mo. The antireflective coating is typically applied to a thickness of about 700 to 2500 Å. The basic agent can be coated over the antireflective coating, or the basic agent can be mixed with the antireflective coating prior to application of the antireflective coating by a spin coating process as described above. The anti-reflective coating is a polymeric film which is highly absorbing and non-bleaching at the radiation exposure wavelengths. A preferred antireflective coating is the aforementioned AZ BARLi, which is an organic dye comprising primarily of cyclohexanone.

After application of the basic agent and/or antireflective coating, a thin layer of photoresist is spin coated over the basic agent layer using a spin coater to a thickness of about 1 to 10 $\mu$m, and more typically about 2½ $\mu$m. Suitable photoresists include positive resists (in which the irradiated regions are soluble in a solvent known as a developer); negative resists (in which the non-irradiated regions are soluble in the developer); image-reversal resists (in which the tone of the image in a positive resist is reversed); and chemically amplified resists. Examples of suitable resists include the AZ 5218, AZ 1370, AZ 1375, or AZ P4400, fabricated by Hoechst Celanese; CAMP 6, manufactured by OCG; DX 46, manufactured by Hoechst Celanese; and the XP 8843, manufactured by Shipley; and "JSR/NFR-016-D2," fabricated by JSR, Japan. Preferably the photoresist is a negative chemically amplified or image reversal photoresist, such as the AZ 5218. Alternative resist materials are disclosed in the article by Wilson, entitled "Organic Resist Material-Theory and Chemistry [Introduction to Microlithography, Theory, Materials and Processing]," editors L. F. Thompson, C. G. Wilson, and M. J. Borden; ACS Symposium Series 219 (1983) 87; American Chemical Society, Washington, which is incorporated herein by reference.

Thereafter, the resist layer is stabilized by "soft-baking" to a temperature of from about 80 to 120° C. for about 60 to 120 seconds in an oven. The soft-bake process step (i) evaporates solvent in the resist to improve the adherence and shape retention of the resist, and (ii) anneals the stresses in the resist caused by the shear forces of the spinning process. Soft-baking is performed in an oven, hot plate, or using infra-red lamps. The time and temperature of the soft-bake process affects the diffusion length of the base into the photoresist.

The baked resist coated substrate 20 is aligned in a stepper to a photomask, and radiant energy is radiated through the mask to expose portions of the resist on the substrate. The mask comprises a pattern of holes and lines and is placed over, or above, the photoresist layer. A typical photomask comprises a transparent support, such as a glass, quartz, or sapphire plate; or polymer film (e.g., cellulose acetate, cellulose nitrate, polyethylene terephthalate, or polyester film). Masking material is deposited on the transparent support by physical vapor deposition, ion plating, or the like. Suitable masking materials include silicon dioxide, titanium, chromium, and the like. The masking pattern is a positive or negative image of the pattern of resist features 22 that is desired on the substrate 20.

The radiant energy can include visible light, infrared light, ultraviolet light, electron beams, x-rays, ion beams, and high density laser beams. Suitable sources of radiant energy include helium-neon lasers, argon lasers, krypton lasers, helium-cadmium lasers, KrF excimer lasers, mercury lamps, metal halide lamps, xenon lamps, or carbon arc lamps. Preferably the radiant energy comprise ultraviolet light having a wavelengths of from about 190 to about 436 nm. For example, KrF and ArF excimer lasers, which emit radiation having a wavelength of 248 and 193, respectively, are suitable sources of radiant energy.

Upon exposure to the radiant energy, and in particular ultraviolet light, image reversal and chemically amplified resists undergo photolysis to generate a catalyst in the exposed areas of the photoresist layer. The exposed portions of the resist layer undergo photolysis to become less chemically soluble than unexposed regions, due to photo-initiated polymerization of the exposed resist portions. The unexposed more soluble regions of the resist layer are thereafter dissolved in a chemical developer solvent to produce a raised, substantially convoluted pattern of resist corresponding to the desired configuration of features on the substrate 20, as described below.

After exposure, the substrate 20 is "post-exposure" baked in an oven at 90 to 120° C. for about 20–90 minutes, to activate the catalyst in the photoresist. A preferred oven bake is for about 90 seconds at a temperature of about 100° C. Alternatively, the substrate 20 can be heated on a hot plate to about 115° C. for about two minutes. The post-exposure baking process promotes the diffusion of the basic agent into the polymeric compounds of the resist layer.

Thereafter, the resist is developed by exposing the resist to an aqueous alkaline developer for about 30–120 seconds. Typically, the substrate 20 is allowed to cool to room temperature before transferring to a spinning chamber, and the developer is sprayed on to the substrate while the substrate is spun. The developer typically functions both as a developer and a replenisher. A suitable developer comprises "AZ 400K," fabricated by Hoechst Celanese. Alternatively, the developer can comprises an nitrous alkaline solution with a concentration or pH greater than 12. The unexposed region of the photoresist layer are dissolved by the developing solution to form a pattern of resist features 22 corresponding to the exposed portions of the resist layer.

It is during the development step, that the effect of the basic agent diffused in the resist layer becomes apparent. The basic agent diffused into the bottom regions of the photoresist layer that are adjacent to the substrate 20, prevents or reduces the cross-linking at these regions of the resist. The reduced cross-linked regions readily dissolve in the developer resulting in resist features 22 having an cross-sectional profile that is larger at the top surface than the bottom surface.

This occurs because upon exposure to the radiant energy, the photoresist compound undergoes a photo-chemical reaction (universal to image-reversal resist and chemically-amplified resists) that generates an acidic byproduct within the photoresist layer. The acidic byproduct serves as a catalyst for the polymerization of the exposed portions of the resist; such polymerization serving to reduce dissolution of the resist during the dissolving step. It is believed that the basic agent diffused into the bottom portions of the resist reduces the concentration or pH of the acidic byproduct in the resist. A reduction in the concentration of acidic byproduct of photochemical reaction at the bottom portions of the resist, reduces the degree of cross-linking and polymerization of the resist at those portions, particularly in negative chemically amplified resists and image-reversal resists. The concentration gradient of the acidic byproduct in the resist feature 22 after exposure is proportional to the absorption of radiation by the resist feature, and the concentration gradient of the basic agent in the resist feature. This combination of factors results in a concentration gradient of acidic byproduct in the resist feature 22 corresponding to the desired reentrant profile 24 in the resist feature prior to cross-linking of the resist. Upon cross-linking of the resist, the high acid concentration regions result in more extensive cross-linking of the resist, and the low concentration regions provide less cross-linked regions. The less cross-linked regions dissolve in the developer solution to form reentrant portions in the resist features 22.

Preferably, the resist features 22 comprise (i) a substantially vertical portion at the top of the features, and (ii) a reentrant portion at the bottom of the features. By "reentrant profile 24," it is meant that the sidewalls of the resist features 22 taper inwardly at the bottom of the to provide a tapered cross-section. More preferably, the reentrant features comprise an elongated cavity parallel to the substrate surface 20, and positioned along the junction of the resist feature 22 and the substrate surface. The undercut or reentrant profile 24 provides features 22 having sidewalls with a negative linear slope such that the width "w" of the features decreases with the depth "d" of the features, as illustrated in FIGS. 2a and 2b.

Figure 3A:
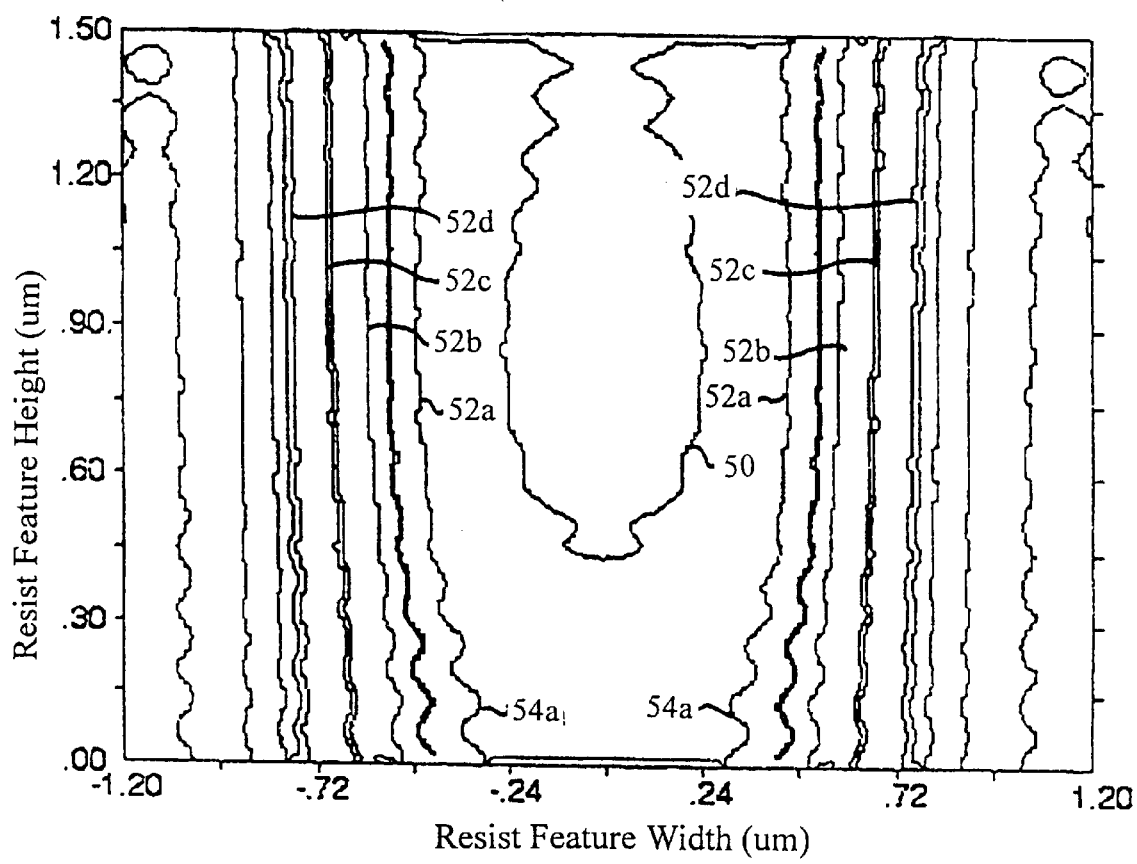
FIG. 3a is a schematic representation of a numeric simulation of the cross-sectional concentration gradient of acidic byproduct in resist features, without use of a basic agent layer, as a function of the height and width of the feature.
Figure 3B:
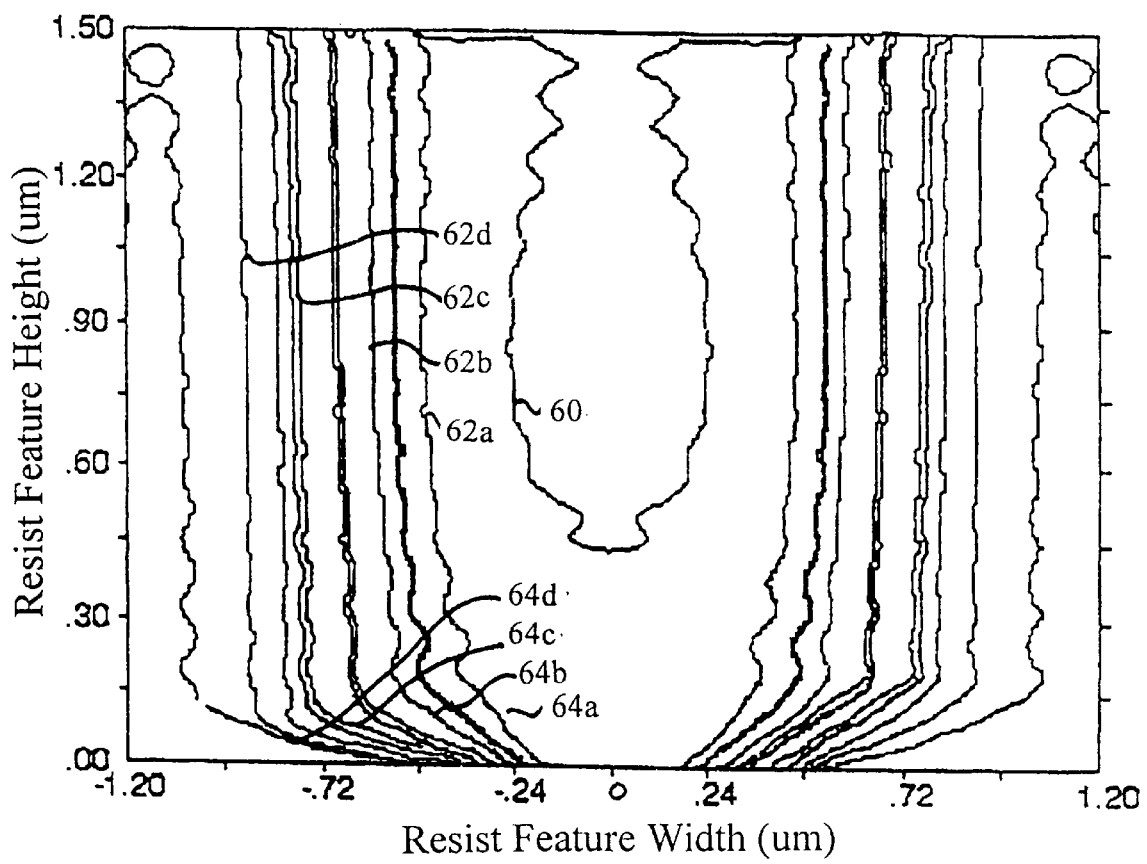
FIG. 3b is a schematic representation of a numerical simulation of the cross-sectional concentration gradient of acidic byproduct in resist features, with use of a basic agent layer, as a function of the height and width of the feature.

Schematic representations of numerical simulations of the concentration of the basic agent across the cross-sectional profile of a typical photoresist feature 22 is shown in FIGS. 3a and 3b. These drawings are schematics of numerical simulations that were performed using "PROLITH ver. 4 and 5" software, fabricated by Finle, Austin, Tex., that simulates chemical reactions in photoresist, and is particularly suitable for simulating reactions in chemically amplified photoresists. The software was programmed with the different chemical parameters of the photoresistivities, absorption of light, bleaching by light, and refractive index. The properties of the layer of basic agent, such as distribution across the substrate surface 20, chemical activity, pH, and diffusion coefficients were also entered. The model selected was that of a negative chemically amplified photoresist layer exposed to a typical basic agent coating on the surface of the substrate 20. The concentration gradients simulated by the program were calculated to account for the mobility of the basic agent in the photoresist during thermally activation of the resist in the soft-bake and post-exposure bake processes.

Referring to FIG. 3a, it is seen that the concentration of the acidic byproduct is highest at the center of the resist feature 22, as shown by the elliptical shaped line 50. The concentration of acidic byproduct across the width of the resist feature 22 is shown by the lines 52a–d, varies across the height of the feature. It is seen that the concentration of acidic byproduct is lowest at the bottom of the feature 22, particularly at the edges of the adjacent to the substrate 20, as shown by the portion 54a of lines 52a. The concentration of acidic byproduct increases to a constant value in the middle and upper portions of the resist features 22. It is this concentration gradient in prior art resist features 22 that results in spreading-out of the bottom of the features.

In contrast, FIG. 3b shows a schematic illustration of a numerically simulated concentration gradient of acidic byproduct across the cross-sectional of a resist feature 22 fabricated using the present process, showing the concentration gradient of acidic byproduct across the width and height of the bottom portion of the resist feature 22. The concentration of acid at the center of the feature 22, as shown by line 60, is not significantly affected by the diffusion of basic agent across the resist. In fact, the concentration and diffusion parameters of the basic agent layer are selected to prevent excessive depletion of acidic byproduct at the center of the resist feature 22; otherwise, the resist feature would break apart when subjected to the developer. However, as shown by the lines 62a–d, the concentration of acidic byproduct at the bottom of feature is significantly lower than that of the conventionally processed resist feature 22 of FIG. 3a. The lower concentration of acid at the bottom of the feature 22, as shown by the line portions 64a–d, results in reduced cross-linking and increased dissolution of the bottom portion of the resist feature in the developer solution, providing a reentrant profile 24 corresponding to the concentration gradient of acidic byproduct in the resist.

The concentration and mobility (during thermal activation of the resist in the soft bake and post-exposure bake processes) of the basic agent in the resist layer, affects the distribution of acidic byproduct in the resist. Generally, smaller basic agent ions diffuse further into the photoresist, providing a large cross-sectional area and width of basic agent within the photoresist feature 22. In contrast, larger basic agent ions diffuse less, providing a smaller area or width of basic agent within the photoresist feature 22. Thus, the shape of the reentrant profile 24 can be controlled by selecting the concentration, diffusion coefficient, and pH of the basic agent. The concentration of the basic agent should not be excessively strong. Basic agents having excessively high concentration or pH values can entirely eliminate cross-linking at the bottom or middle of the resist feature 22, causing the to collapse during development. Also, the diffusion coefficient of the basic agent should not be excessively high, as this would cause diffusion into the entire resist feature 22; whereas, the reentrant undercutting is only desirable at the bottom edge of the feature.

In addition, diffusion of the basic agent into the resist feature 22 can be enhanced using higher temperature/time treatments of the resist layer during the soft bake and post-exposure bake processes. Preferably, the temperature of the soft and post-exposure bakes are less than about 150° C., and more preferably from about 60 to 140° C., to provide the desired level of diffusivity for the basic agents described herein.

The basic agent coating of the present invention provides significant advantages over the prior art. First, this process is simple to perform and can use nontoxic basic materials. Also, the concentration, diffusion coefficient, and pH of the basic agent can be selected (or tailored) to provide the desired cross-sectional profile of the resist feature 22. The thickness or the time/temperature treatment of the basic agent in the resist can also be used to control the shape of the resist feature 22, allowing the present process to be tailored to achieve different shaped resist features for different applications. Furthermore, control of the diffusion of the basic agent into the resist layer is more reliable method, and less dependent on time and temperature, than conventional surface-activated reactions. For these reasons, the present process provides significant advantages over the prior art.

After the desired shape of the resist feature 22 is obtained, material 70 is deposited onto and between the resist features, or material can be etched from portions of the substrate 20 lying between the features. The features 22 formed on the substrate 20 by such processes, are typically sized from about 0.2 to about 10 microns, and more typically about 0.4 to 2 microns; and the spacing between the features is typically from 0.2 microns to 10 microns. Suitable etching and deposition processes are described in Chapters 5, 6, and 9, in VLSI Technology, 2nd edition, Ed. by S. M. Sze, McGraw-Hill Publ., NY (1988), which is incorporated herein by reference. For example, conductive material can be deposited over the patterned photoresist features 22 to form metal-containing features that electrically interconnect active devices, such as electronic circuit or thin film magnetic head components; or to form magnetic circuit components, such as the ferromagnetic cores of thin film heads. Typically, the conductive or magnetic material deposited on the substrate 20 comprises a metal-containing material, such as for example, aluminum, antimony, beryllium, bismuth, cadmium, chromium, cobalt, copper, gallium, germanium, gold, indium, iron, lead, magnesium, manganese, molybdenum, nickel, palladium, platinum, rhodium, selenium, silicon, silver, strontium, tellurium, tin, titanium, tungsten, vanadium, and zinc. Conductive high temperature materials such as the silicides of tungsten, molybdenum, and titanium, can also be used to form interconnect features, plugs, and lines. Dielectric materials such as oxides and nitrides, for example, aluminum oxide, silicon dioxide, and silicon nitride, can also be deposited or lifted-off from the substrate. The conductive, dielectric, or magnetic material can be deposited by a variety of deposition techniques including electroplating, physical vapor deposition, and chemical vapor deposition. Magnetic materials typically deposited by sputtering include cobalt, nickel, iron, and mixtures thereon. Copper and gold containing materials used to form corrosion resistance electrical interconnects, are typically sputtered; and titanium and aluminum containing materials are sputtered or electroplated. Metal compounds such as the silicides of titanium, tungsten, and molybdenum are typically deposited by chemical vapor deposition methods. The conductive layer is deposited to a thickness of typically from about 6 to about 10 $\mu$m.

Thereafter, a residual resist stripping or removal step, such as a chemical dissolution or etch process, is used to remove the residual resist. The reentrant resist features 22 cause a shadowing effect during deposition, that results in formation of an elongated void 72a–d substantially absent deposition material, at the edge of the bottom surface of the resist feature 22 in contact with the substrate 20, as schematically illustrated in FIG. 2c. It is through these voids 72a–d that a resist removing solvent or plasma enters to dissolves the residual resist. Wet chemical etching, commonly known as a lift-off process, uses a solvent that dissolves the residual resist. Suitable solvents include acetone, η-methylpyrolidone (NMP), and "ACT-150," Ashland Chemicals. Typically, the substrate 20 is exposed to the solvent for about 10 to 60 mins, and certain resist strippers are heated to a temperature of about 20–80° C. Preferably, the resist stripping step is performed in an ultrasonic bath.

The stripper penetrates into the voids 72a–d formed in the conductive material, and adjacent to the reentrant profiles 24 of the resist features 22, to remove substantially all the residual resist.

The present process provides control of the cross-sectional profile of resist features 22 and is particularly useful for forming features of chemically non-reactive materials, such as gold, that are used to interconnect thin film circuits. Gold is nonreactive and inert to most dissolution chemicals, and when evaporated onto the substrate 20 to form a conformal layer over the resist features 22, the gold layer protects and prevents access of the dissolution chemical or plasma to the underlying resist layer. In conventional processes, the conformally chemically resistant deposited layer prevents the dissolution solvent from penetrating below the conductive layer to dissolve the underlying resist. However, the reentrant or undercut sidewalls of the resist features 22 causes a shadowing effect during the deposition process, that reduces deposition of material at the edges and corners of the resist features immediately adjacent, and in contact with, the substrate 20. The shadowing effect prevents deposition of material at the edges and corner portions of the resist features 22, causing the undercut resist feature to form an elongated void 72a–d along the edge of the bottom of the resist feature. The size of the void 72a–d or the degree of undercutting depends upon the magnitude of the negative slope of the sidewalls, or undercutting, of the resist features 22. The dissolution solvent enters through this void 72a–d to chemically dissolve the residual resist, proceeding from the bottom of the feature 22 towards the top of the feature. Dissolution of the resist feature 22 from bottom to the top, allows the conductive material deposited over the top of the features to break apart without damaging the profile of conductive material deposited between the resist features 22. This allows fabrication of ultra fine interconnect and circuitry features with accuracy and reproducibility.

EXAMPLE

In this example, conductive leads 100 that interconnect components of magnetoresistive sensors 102 were fabricated using the present process. Magnetoresistive sensors 102 are useful for magnetic recording applications because they are capable of reading magnetic data having high linear densities. A magnetoresistive sensor 102 is typically a "read" only sender that detects magnetic field signals through resistant changes in a magnetoresistive element, that are induced as a function of the magnetic flux being sensed. During a typical "read" operation, a current passed through the magnetoresistive element via conductive leads 100 connected to the magnetoresistive element fluctuates in relationship to the change in resistance induced by magnetized storage media transported past the sensor 102. A spike in the current indicates a magnetic transition from a zero to a one signal, or vice versa. The linear recording densities in narrower recording tracks make it critical that the active devices of the sensor 102 are sufficiently miniaturized to allow accurate reading of narrow tracks. Also, because magnetic "writing" heads typically form zigzag domains at the edge of the magnetic track, it is desirable for the magnetoresistive sensor 102 to be narrower than the magnetic head. Typically, the magnetoresistive sensor is formed by depositing bar strips of ferromagnetic material on a substrate 20, and lapping the bar strips into the magnetic poles that appear through the surrounding magnetic insulator, each pole being about one-tenth of a micron in size. The sensor 102 is constructed on a structure that allows it to fly over the recording media with reduced friction and good aerodynamics.

Figure 4A:
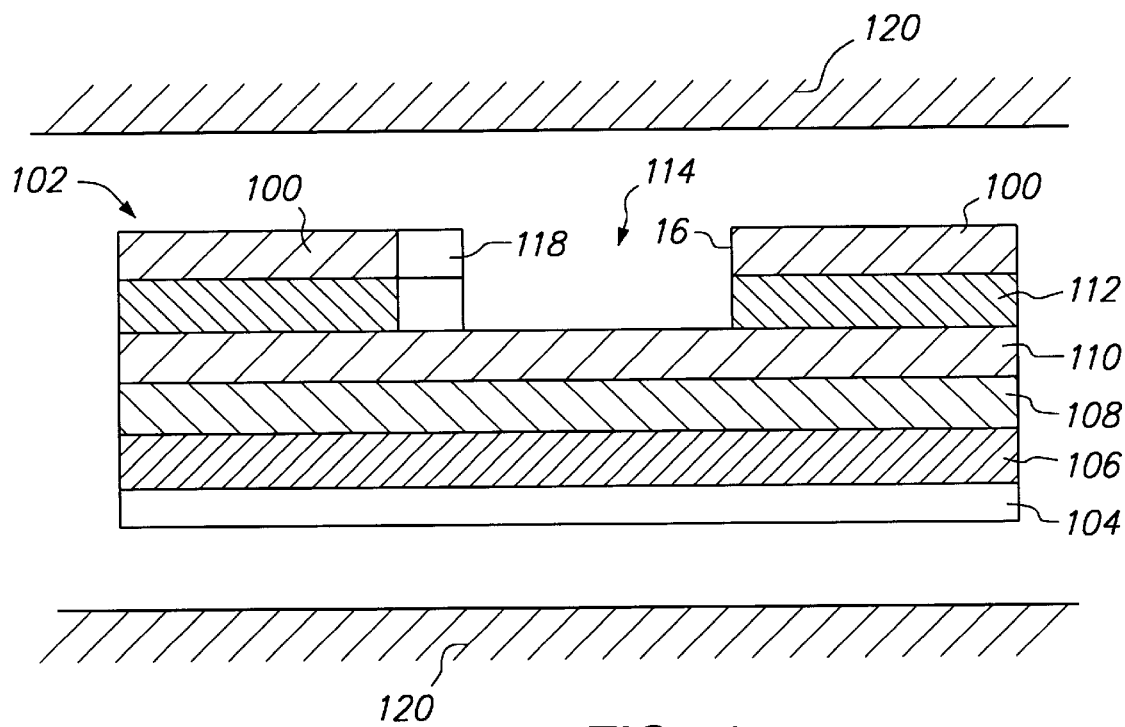
FIG. 4 is a schematic cross-sectional side view of a typical magnetoresistive head formed by the process of the present invention.

Suitable substrates 104 for the magnetoresistive sensor 102 include silicon carbide and $TiO_2$ sintered substrates, which are typically about 3 inches in diameter and about 2 mm thick; suitable substrates being commercially available from Sumatomo, Japan, such as the "AC-7"; and Koyocera, Calif. An exemplary magnetoresistive sensor 102, as illustrated in FIG. 4a, comprises a soft adjacent layer (SAL) which is soft magnetic film 106 (typically NiFeRh or NiFeMo) of about 180 to 260 Å thickness, deposited on the substrate 104 to provide a soft magnetic film transfer bias. A nonmagnetic decoupling layer 108 of tantalum approximately 75 to 125 Å thick covers the SAL layer to provide a physical separation necessary for the overlying magnetoresistive layer 110 and the underlying SAL layer to produce opposite magnetization rotations.

The magnetoresistive layer 110 is deposited on the decoupling layer 108 to a thickness of about 200 to 300 Å. The magnetoresistive element is formed using a suitable magnetoresistive material, such as Ni, Fe, Co, Rh, Mo, or compounds and alloys thereof, such as for example, nickel-iron (Ni—Fe) alloy. An antiferromagnetic material 112 is deposited over the magnetoresistive layer 110, with an overlying magnetic shielding layer, to define an exposed magnetoresistive sensor element 114. Conductive leads 100 by metal-containing material—for example, copper, tungsten, or gold—are formed on opposing sides of the magnetoresistive element 114. The conductive leads 100 are typically deposited to a thickness of about 2000 Å between the resist features 22 formed on the substrate 104 using the present process. The facing surfaces 116, 118 of the conductive leads 100 are parallel to one another and define the active magnetoresistive element 114 therebetween. A magnetic shield 120 encloses the magnetoresistive sensor 102. During operation, current flows from the first lead 100a through the active region of the magnetoresistive layer 110 to the second lead 100b. A preferred magnetoresistive structure is described in, for example, commonly assigned U.S. Pat. No. 5,483,402, issued Jan. 9, 1996, to Batra.

In the process of forming conductive leads 100 of gold, a basic agent is coated on the substrate 104 using a spin coater operated in ambient air at a rotational speed of about 4000 rpm. Suitable basic agents include the (i) "AZ-400K" is drip fed onto the 3-inch diameter substrate 104 at a flow rate of 200 ml/min for about 5 seconds (example 1); (ii) potassium hydroxide at a pH of 13.92 (example 2), or (iii) ethylenediamine at a pH of 14 (example 3). Thereafter, photoresist material such as "AZ-5214" is coated over the basic agent to a thickness of about 0.7 µm to 2.4 µm, using conventional resist coating processes.

The substrate 104 is soft-baked at a temperature of 90° C. for 20 minutes in an oven. The substrate 104 is cooled to room temperature, aligned in a stepper apparatus, and exposed to ultraviolet light of about 390–440 nm using a mercury lamp. Thereafter, the substrate 104 is post-exposure baked at 115° C. on a hot plate for 2 minutes. The substrate 104 is again cooled to room temperature and exposed to a developer in a spinner apparatus, such as "AZ 400K" developer, to dissolve the unexposed portions of the substrate to provide resist features 22 having reentrant profiles 24.

The spread-out foot at the bottom of a resist feature 22 prepared on a substrate 104 using a conventional process is shown in the scanning electron microscope (SEM) photo of FIG. 5a; the surface of this substrate having an acidic pH of 3.53. In sharp contrast, the increased reentrant angles of the bottom of the resist features 22 obtained on substrates 104 coated with basic agents having high concentration or pH values, are shown in the SEM photos of FIGS. 5b to 5d. It is seen that the lowest concentration or pH basic agent, namely "AZ 400K" developer, produces a reentrant feature having the smallest depths as shown in FIG. 5b; an increased ph of about 13.92 produces a more defined reentrant profile 24 as shown in FIG. 5c; and the highest concentration or pH basic agent solution of ethylenediamine at a pH of about 14 produces a deep trenched reentrant profile as shown in FIG. 5d.

After formation of the reentrant resist features 22, conductive gold was deposited over the and between the resist features using conventional evaporation or sputtering techniques using a gold target. Thereafter, the residual resist below the conformal gold layer deposited on the substrate 104 are dissolved in a solvent allowing penetration of the solvent into the voids 72a–d formed at the edges of the reentrant resist features. The process produced ultra fine conductive leads 100 having a width spacing of about 1 ¼ to 4 microns, demonstrating the utility of the present invention for forming miniaturized magnetoresistive heads.

Figure 4B:
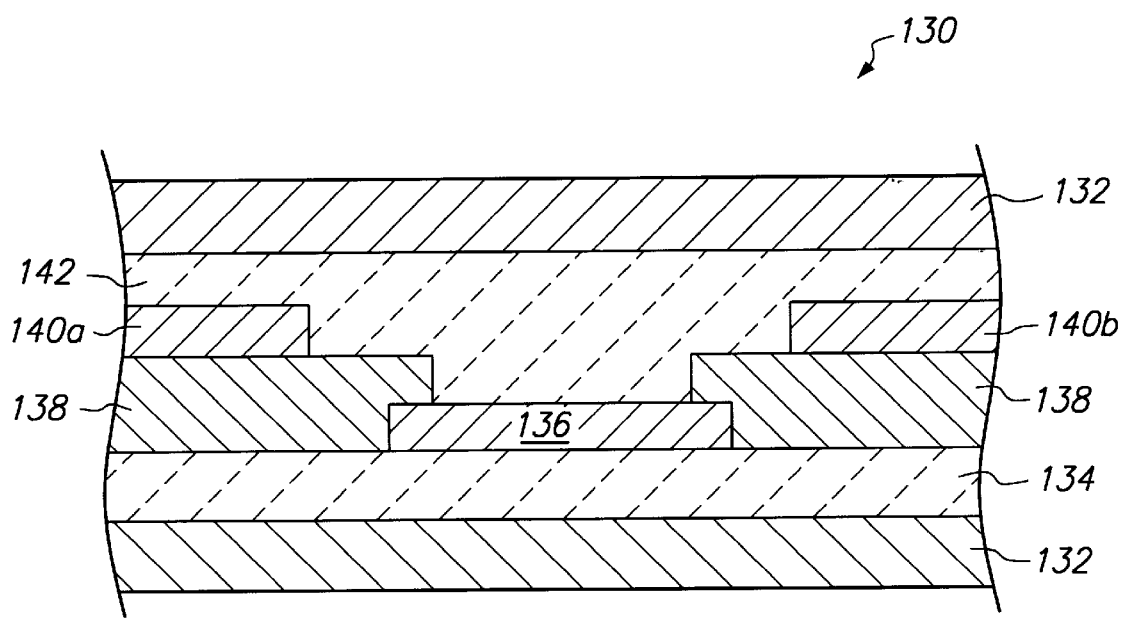

An alternative magnetoresistive element structure 130 that can be fabricated by the process of the present invention is shown in FIG. 4b. Magnetic shields 132 surround the magnetoresistive element. The magnetic components are formed on an insulator layer 134. A magnetoresistive layer 136 is deposited on the insulator layer to a thickness of about 200 to 300 Å. The magnetoresistive element is formed using a suitable magnetoresistive material, such as Ni, Fe, Co, Rh, Mo, or compounds and alloys thereof, such as for example, nickel-iron (Ni—Fe) alloy. A magnetic material 138 (typically NiFeRh or NiFeMo) is deposited on the substrate 104 to lap over the magnetoresistive layer 136 to define an exposed magnetoresistive sensor element 114. Conductive leads 140a, 140b of metal-containing material—for example, copper, tungsten, or gold—are formed on opposing sides of the magnetoresistive element 114. The conductive leads 140 a,b are typically deposited to a thickness of about 2000 Å between the resist features formed on the insulator substrate 134 using the present process. An insulator layer 142 encloses the magnetoresistive element 136. During operation, current flows from the first lead 140a through the active region of the magnetoresistive layer 136 to the second lead 140b.

The present invention has been described in considerable detail with reference to preferred versions that are provided only to illustrate the invention and should not be used to limit the scope of the invention. For example, the process of the present invention is also useful for forming interconnects and coils of thin film magnetic heads which comprise a core of ferromagnetic material, such as NiFe (permalloy), NiFeRh, or NiFeMo alloy, with a coil wrapped around the ferromagnetic core. When a current is passed through the coil surrounding the ferromagnetic core, the current induces a magnetic flux that writes on magnetic data storage media passed by the head. In typical magnetic disc and tape drives, the magnetic write head is used in combination with the magnetoresistive reading element 114 to form an assembly capable of reading and writing magnetic data. An exemplary magnetic head coil structure is described in U.S. Pat. No. 5,448,822, which is incorporated herein by reference. In another example, the present process is also useful for forming features 22 on semiconductor substrates 104 to form integrated circuit chips and electronic components. Thus, the spirit and scope of the appended claims should not be limited to the description of the preferred versions contained herein.

What is claimed is:

1. A method of forming resist features having reentrant profiles on a surface of a substrate, the method comprising the steps of:
   (a) forming a layer of a basic agent on the substrate surface;
   (b) forming a resist layer on the layer of basic agent so that at least a portion of the basic agent diffuses into regions of the resist layer to provide a concentration gradient of basic agent in the resist layer;
   (c) exposing the resist layer to radiant energy through a mask to form a patterned resist layer; and
   (d) developing the patterned resist layer to form resist features having reentrant profiles at the regions of the resist layer comprising the basic agent.

2. The method of claim 1, wherein in step (a) the basic agent comprises a pH of from about 7.1 to about 14.

3. The method of claim 2, wherein in step (a) the basic agent comprises a pH of at least about 11.

4. The method of claim 1, wherein the concentration of basic agent is selected to be sufficiently high to diffuse into regions of the resist layer in an amount that is sufficiently high to neutralize the acidic byproducts of the photochemical reaction formed in said regions upon exposure of the resist to the radiant energy.

5. The method of claim 4, wherein the concentration of basic agent is selected to be sufficiently high to diffuse into regions of the resist layer in an amount that is sufficiently low to prevent complete neutralization of the acid byproducts formed in the resist during exposure to the radiant energy.

6. The method of claim 1, wherein in step (a) the basic agent is selected from the group consisting of alkali metal hydroxides, alkaline earth metal hydroxides, alkylammoniums, metal carbonates, and secondary or tertiary metal phosphates.

7. The method of claim 1, wherein in step (a) the basic agent is selected from the group consisting of sodium phosphate, potassium phosphate, ammonium phosphate, sodium carbonate, potassium carbonate, ammonium carbonate, sodium hydrogen carbonate, potassium hydrogen carbonate, ammonium hydrogen carbonate, ammonium hydroxide, sodium hydroxide, potassium hydroxide, and lithium hydroxide.

8. The method of claim 1, wherein in step (a) the basic agent comprises (i) aliphatic amines having the general formula R—$NH_2$, where R is a hydrogen, hydroxy, or alkyl group, (ii) alkyl-substituted aromatic amines, or (iii) hydroxylalkyl-substituted aromatic amines.

9. The method of claim 1, wherein in step (a) the basic agent is selected from the group consisting of hydroxylamines, aliphatic polyamines, monomethylamine, dimethylamine, trimethylamine, monoethylamine, diethylamine, triethylamine, ethylenediamine, monoisopropylamine, di-isopropylamine, tri-isopropylamine, η-butylamine, monoethanolamine, diethanolamine, triethanolamine, monoisopropanolamine, di-isopropanolamine, tri-isopropanolamine, imine, and pyridine.

10. The method of claim 1, wherein in step (a) the basic agent is selected from the group consisting of phenylenediamine, tolylenediamine, diamino-diphenyl-ether, diamino-diphenyl sulfone, diamino-diphenyl-methane, diamino-diphenyl-sulfide, diamino-diphenyl-ketone, aminophenyl propanes, aminophenoxy-benzenes, aminophenyl-pentenes, aminobenzylbenzene, diaminoaphthalene, phosphine oxide, diamino azobenzene, diamino diphenylurea, aminophenoxyphenyl, aminophenoxypheny-benzophenone, aminophenoxy-diphenyl-sulfone, dimethyl-aminobenzyl phenoxy benzophenone, diamino-hydroxybenzene, dihydroxy-diaminobiphenyl, amino-hydroxyphenyl propanes, amino-hydroxyphenyl-alkanes, aminopropyldimethylsilyl benzene, dimethoxy-diaminobiphenyl, dimethyl-diaminobiphenyl, aminophenyl anthracene, aminophenyl fluorene, and diaminobenzamilide.

11. The method of claim 1, wherein in step (a), the basic agent comprises a base precursor that is capable of forming a base upon activation by radiant energy or thermal energy.

12. The method of claim 1, wherein step (a) comprises applying a liquid basic agent onto the substrate surface.

13. The method of claim 12, wherein in step (a) the liquid basic agent is applied onto the substrate surface by spraying, flow-coating, roller-coating, spin-coating, or immersion coating.

14. The method of claim 1, wherein in step (b) the resist layer is applied on the substrate so that the basic agent diffuses into regions of the resist layer adjacent to the junction of the resist layer and the substrate.

15. The method of claim 1, wherein in step (d), the reentrant resist features comprise sidewalls connecting a top surface to a bottom surface, the top surface being wider than the bottom surface to provide a tapered cross-section.

16. The method of claim 1, further comprising at least one of the following steps:
   (a) depositing material over and between the resist features; or
   (b) etching portions of the substrate between the resist features.

17. A method of forming resist features having predefined cross-sectional profiles on a substrate, the method comprising the steps of:
   (a) forming a layer of a basic agent on a substrate;
   (b) forming a resist layer over the basic agent layer so that the basic agent diffuses into regions of the resist layer to provide a concentration gradient of basic agent in the resist layer;
   (c) irradiating the resist layer with radiant energy through a mask to activate portions of the resist layer forming an acidic byproduct in the resist, wherein the concentration of basic agent diffused into the resist layer is sufficiently high to neutralize the acidic byproduct at said regions of the resist layer to allow formation of resist features having the predefined cross-sectional profile; and
   (d) developing the resist layer to dissolve (i) unirradiated portions of the resist layer, and (ii) irradiated portions of the resist layer in which the acidic byproduct is substantially neutralized by the basic agent, to form resist features having the predefined cross-sectional profile.

18. The method of claim 17, wherein in step (a) the basic agent comprises a pH of from about 7.1 to about 14.

19. The method of claim 17, wherein in step (a) the basic agent is selected from the group consisting of alkali metal hydroxides, alkaline earth metal hydroxides, alkylammoniums, metal carbonates, and secondary or tertiary metal phosphates.

20. The method of claim 17, wherein in step (a) the basic agent comprises (i) an aliphatic amine having the general formula R—$NH_2$, where R is a hydrogen, hydroxy, or alkyl group, or (ii) an alkyl-substituted aromatic amines, or (iii) an hydroxylalkyl-substituted aromatic amine.

21. The method of claim 17, wherein in step (a), the basic agent comprises a base precursor that is capable of forming bases upon activation by radiant energy or thermal energy.

22. The method of claim 17 wherein step (a) comprises applying liquid basic agent onto the substrate surface by spraying, flow-coating, roller-coating, spin-coating, or immersion coating.

23. The method of claim 17, wherein in step (b) the resist layer is applied on the substrate so that the basic agent diffuses into regions of the resist layer adjacent to the junction of the resist layer and the substrate to produce resist features having reentrant profiles.

24. The method of claim 17, further comprising at least one of the following steps of:
    (a) depositing material onto and between the resist features; or
    (b) etching portions of the substrate between the resist features.

25. A method of forming magnetoresistive sensor comprising the steps of:
    (a) forming a layer of a basic agent on a substrate surface;
    (b) forming a resist layer on the layer of basic agent so that at least a portion of the basic agent diffuses into regions of the resist layer to provide a concentration gradient of basic agent in the resist layer;
    (c) exposing the resist layer to radiant energy through a mask to form a patterned resist layer;
    (d) developing the patterned resist layer to form resist features having reentrant profiles at the regions of the resist layer comprising the basic agent;
    (e) depositing material between the resist features having the reentrant profile; and
    (f) dissolving the resist features using a resist stripper.

26. The method of claim 25, wherein in step (a) the basic agent comprises a pH of from about 7.1 to about 14.

27. The method of claim 25 wherein the concentration of basic agent is selected to be sufficiently high to diffuse into regions of the resist layer in an amount that is sufficiently high to neutralize the acidic byproducts of the photochemical reaction formed in said regions upon exposure of the resist to radiant energy.

28. The method of claim 27, wherein the concentration of basic agent is selected to be sufficiently high to diffuse into regions of the resist layer in an amount that is sufficiently low to prevent complete neutralization of the acid byproducts formed in the resist during exposure to the radiant energy.

29. The method of claim 25, wherein in step (a) the basic agent is selected from the group consisting of alkali metal hydroxides, alkaline earth metal hydroxides, alkylammoniums, metal carbonates, and secondary or tertiary metal phosphates.

30. The method of claim 25 wherein in step (a) the basic agent is selected from the group consisting of sodium phosphate, potassium phosphate, ammonium phosphate, sodium carbonate, potassium carbonate, ammonium carbonate, sodium hydrogen carbonate, potassium hydrogen carbonate, ammonium hydrogen carbonate, ammonium hydroxide, sodium hydroxide, potassium hydroxide, and lithium hydroxide.

31. The method of claim 25 wherein in step (a) the basic agent comprises (i) aliphatic amines having the general formula $R-NH_2$, where R is a hydrogen, hydroxy, or alkyl group, (ii) alkyl-substituted aromatic amines, or (iii) hydroxylalkyl-substituted aromatic amines.

32. The method of claim 25 wherein in step (a) the basic agent is selected from the group consisting of hydroxylamines, aliphatic polyamines, monomethylamine, dimethylamine, trimethylamine, monoethylamine, diethylamine, triethylamine, ethylenediamine, monoisopropylamine, di-isopropylamine, tri-isopropylamine, η-butylamine, monoethanolamine, diethanolamine, triethanolamine, monoisopropanolamine, di-isopropanolamine, tri-isopropanolamine, imine, pyridine, phenylenediamine, tolylenediamine, diamino-diphenyl-ether, diamino-diphenyl sulfone, diamino-diphenyl-methane, diamino-diphenyl-sulfide, diamino-diphenyl-ketone, aminophenyl propanes, aminophenoxy-benzenes, aminophenyl-pentenes, aminobenzylbenzene, diaminoaphthalene, phosphine oxide, diamino azobenzene, diamino diphenylurea, aminophenoxyphenyl, aminophenoxypheny-benzophenone, aminophenoxy-diphenyl-sulfone, dimethyl-aminobenzyl phenoxy benzophenone, diamino-hydroxybenzene, dihydroxy-diaminobiphenyl, amino-hydroxyphenyl propanes, amino-hydroxyphenyl-alkanes, aminopropyldimethylsilyl benzene, dimethoxy-diaminobiphenyl, dimethyl-diaminobiphenyl, aminophenyl anthracene, aminophenyl fluorene, and diaminobenzamilide.

33. The method of claim 25, wherein in step (a), the basic agent comprises a base precursor that is capable of forming a base upon activation by radiant energy or thermal energy.

34. The method of claim 25, wherein step (a) comprises applying a liquid basic agent onto the substrate surface by spraying, flow-coating, roller-coating, spin-coating, or immersion coating.

35. The method of claim 25, wherein in step (d), the reentrant resist features comprise sidewalls connecting a top surface to a bottom surface, the top surface being wider than the bottom surface to provide a tapered cross-section.

* * * * *